United States Patent
Huang

[11] Patent Number: 6,117,725
[45] Date of Patent: Sep. 12, 2000

[54] METHOD FOR MAKING COST-EFFECTIVE EMBEDDED DRAM STRUCTURES COMPATIBLE WITH LOGIC CIRCUIT PROCESSING

[75] Inventor: Jenn Ming Huang, Hsin-Chu, Taiwan

[73] Assignee: Taiwan Semiconductor Manufacturing Company, Hsin-Chu, Taiwan

[21] Appl. No.: 09/372,075

[22] Filed: Aug. 11, 1999

[51] Int. Cl.[7] .................................................. H01L 21/8242
[52] U.S. Cl. .......................... 438/241; 438/256; 438/630
[58] Field of Search .................................... 438/241, 253, 438/256, 396, 399, 626, 629, 630, 675

[56] References Cited

U.S. PATENT DOCUMENTS

| | | | |
|---|---|---|---|
| 5,719,079 | 2/1998 | Yoo et al. | 438/238 |
| 5,858,831 | 1/1999 | Sung | 438/241 |
| 5,863,820 | 1/1999 | Huang | 438/241 |
| 5,920,775 | 7/1999 | Koh | 438/241 |
| 5,998,251 | 7/1999 | Wu et al. | 438/241 |

Primary Examiner—Chandra Chaudhari
Attorney, Agent, or Firm—George O. Saile; Stephen B. Ackerman

[57] ABSTRACT

A method for making an embedded DRAM structure with logic circuits having high performance salicide FETs is achieved. After forming the DRAM FETs and the logic salicide FETs, a planar first insulating layer is deposited, and contact openings are etched and filled with tungsten (W) to form FET and bit-line contacts and to form DRAM capacitor node contacts. A first metal is patterned to form the first metal interconnections including the DRAM bit lines. A second insulating layer is deposited and planarized. Openings are etched to form first vias for the FET metal interconnections and concurrently to form openings for the DRAM capacitor bottom electrodes. The openings are filled with tungsten to form W contacts in the vias and to form bottom electrodes. A thin high-k dielectric is formed over the bottom electrodes, and a second metal is deposited and patterned to form capacitor top electrodes and a second level of metal interconnections. The metal layers and the high-k dielectric layer allow low-temperature processing that is not possible with the more conventional polysilicon DRAM capacitor process. Therefore, this invention prevents salicide FET degradation due to high-temperature processing, while providing a cost-effective process.

16 Claims, 8 Drawing Sheets

METHOD FOR MAKING COST-EFFECTIVE EMBEDDED DRAM STRUCTURES COMPATIBLE WITH LOGIC CIRCUIT PROCESSING

BACKGROUND OF THE INVENTION (1) Field of the Invention

This invention relates to semiconductor integrated circuit devices, and more particularly to a method for integrating dynamic random access memory (DRAM) circuits with logic circuits. The method is particularly useful for integrating DRAM cells with field effect transistors (FETs) formed by the self-aligned silicide (SALICIDE) process. The DRAM process is compatible with the salicide process by reducing the thermal budget (time at temperature) required for processing the merged logic/DRAM chips. The method uses two levels of metal to concurrently form the DRAM capacitors and the metal interconnections for the logic, thereby providing a plane structure using a cost-effective process.

(2) Description of the Prior Art

Merged logic and memory circuits are finding extensive use in the electronics industry. These circuits, such as microprocessors, are used in the computer industry for general purpose computing. Merged integrated circuits are also used for application-specific circuits (ASC) in other industries, such as automobiles, toys, communications, the like.

To optimize these merged circuits, it is desirable in the electronics industry to fabricate the FETs for the logic and DRAM circuits having different processes and therefore different electrical parameters. For example, it is desirable to use a thin gate oxide for the logic FETs and the peripheral circuits for the DRAM FETs to increase performance (circuit speed), while it is desirable to use a thicker gate oxide, narrower sidewall spacers, and self-aligned contacts (SACs) for the FET access transistors of the DRAM memory cells because of the higher gate voltage ($V_g$), and also to achieve high density of memory cells and higher yield. It is desirable to integrate the logic and memory circuits on the same chip using shared process steps to minimize the manufacturing costs.

The process of choice for making the FETs for the logic circuits on the chip is to use the self-aligned silicide process (SALICIDE process) and to use tungsten silicide FET gate electrodes for the memory cell region. The SALICIDE process for the logic consists of forming a doped electrically conducting polysilicon layer which is patterned to form the FET gate electrodes over a thin gate oxide on the silicon substrate. Lightly doped drain (LDD) areas are formed adjacent to the gate-electrode regions, and insulating sidewall spacers are formed on the gate electrodes. A second implant is used to form the ohmic source/drain contacts in the substrate adjacent to the sidewalls. A thin metal layer, such as titanium (Ti), is deposited and annealed to form a $TiSi_x$ on the exposed silicon surfaces of the gate electrodes and on the adjacent source/drain contact areas. The unreacted Ti on the insulating surfaces (e.g., silicon oxide) is selectively removed to complete the SALICIDE FETs.

When the channel length of the FET is reduced (currently to less than 0.18 micrometers) to improve circuit performance, it is necessary to use very shallow diffused junctions for the implanted source/drain areas and thin metal silicide contacts to avoid short channel effects, such as punchthrough, Unfortunately, in the current DRAM circuit of choice, the memory cells are fabricated using stacked capacitors which are formed over the memory cell areas after the SALICIDE FETs are completed. The conventional DRAM capacitors are formed using several layers of doped poly-silicon which require high-temperature processing for extended periods of time that can electrically degrade the very shallow (<0.1 um) implanted source/drain junctions and the thin $TiSi_x$ contacts. Therefore, there is a strong need in the industry to fabricate DRAM stacked capacitors at reduced temperatures and/or shortened times (commonly referred to as the "thermal budget" in the industry) to prevent degrading the narrow channel/shallow junction FET devices.

Numerous methods of forming logic circuits with embedded DRAM devices have been reported in the literature. One method of making merged or embedded DRAM devices with logic circuits is described in U.S. Pat. No. 5,858,831 to Sung. Sung's method teaches a process for forming FETs for logic and for DRAMs having different gate oxide thicknesses, while minimizing the number of masking steps. Huang in U.S. Pat. No. 5,863,820 teaches a method for integrating DRAMs with self-aligned contacts and salicide FETs for logic on the same chip. Yoo et al. in U.S. Pat. No. 5,719,079 describe a method for making static RAM (SRAM) using a salicide process. However, none of the references addresses making low-temperature DRAMs embedded with logic circuits having salicide FETs.

Therefore there is still a need in the semiconductor industry to fabricate embedded DRAM devices using a low thermal budge process to prevent electrical degradation of the salicide PETs while providing a cost-effective manufacturing process.

SUMMARY OF THE INVENTION

It is a principal object of the present invention to provide a method for forming embedded DRAM circuits that are compatible with high-performance self-aligned metal silicide FETs on logic circuits.

It is another object of the present invention to achieve the above objective by using a low-temperature process for fabricating the DRAM capacitors and concurrently forming the metal interconnections without excessive thermal budget that can degrade the salicide FETs.

Another object of the present invention to achieve the above objective is to make the DRAM capacitors utilizing metal layers that are deposited at lower temperatures and which are not achieved by the more conventional polysilicon process.

Yet another objective is to concurrently form the DRAM capacitors and the electrical interconnections to provide a cost-effective manufacturing process.

The method for integrating these metal DRAM capacitors with logic circuits having salicide FETs is now briefly described. As the circuit density increases to achieve high-performance circuits, it is necessary to use self-aligned silicide FETs having very shallow diffused junctions with silicide contacts. This necessitates using low-temperature processing for making the subsequent DRAM capacitors to prevent electrically degrading the salicide FETs.

After forming the salicide FETs for logic circuits and the FETs for the DRAM memory cells on a P⁻ doped single-crystal silicon substrate, the method of completing the DRAM devices having capacitors formed by low-temperature processing begins by forming a planar first insulating layer, commonly referred to as an interlevel dielectric (ILD) layer, over the FETs on the substrate. First openings are etched in the planar first insulating layer to form the contact openings for contacts to the salicide FETs, and concurrently openings are etched for the bit-line contacts and capacitor node contacts in the memory regions. A metal layer, such as tungsten (W), is deposited and is polished or etched back to the first insulating layer to form metal plugs in the contact openings. A first metal layer, such as aluminum-copper (AlCu), is deposited at low temperature, for example by physical vapor deposition, and a silicon nitride ($Si_3N_4$) cap layer is deposited by plasma-enhanced chemical vapor deposition (PECVD) on the AlCu. The cap layer and the AlCu layer are patterned to form a first level of metal interconnections for the logic, and also to form the bit lines for the DRAM circuits. Next, a conformal $Si_3N_4$ layer is deposited and anisotropically etched back to form sidewall spacers on the metal interconnections. A relatively thick second insulating layer, such as silicon oxide ($SiO_2$) or a borophosphosilicate glass (BPSG), is deposited at low temperature by PECVD, and is planarized over the metal interconnections and bit lines. The second insulating layer is commonly referred to as an intermetal dielectric (IMD) layer. Conventional photolithographic techniques and anisotropic plasma etching are used to etch second openings over and to the capacitor node contacts, and are self-aligned to the bit lines. Another masking step and plasma etching are used to etch via holes in the second insulating layer and in the $Si_3N_4$ cap layer to the first level of metal interconnections for the salicide FETs. A metal layer, such as tungsten (W), is deposited at low temperature by CVD using $WF_6$ and $H_2$ to fill the second openings and the via holes, and the metal is polished back to the surface of the second insulating layer to concurrently form capacitor bottom electrodes and W contacts in the via holes. Optionally, a photoresist mask and etching can now be used to recess the second insulating layer to the $Si_3N_4$ cap layer on the bit lines and around the bottom electrodes to increase surface area of the bottom electrodes thereby increasing capacitance. Continuing, an interelectrode dielectric layer, such as tantalum pentoxide or barium strontium titanium oxide is deposited at low temperature on the substrate, and is patterned to leave portions over the capacitor bottom electrodes. A second metal layer, such as AlCu, is deposited and patterned to form a second level of electrical interconnections and concurrently to form the capacitor top electrodes. Additional levels of IMD layers and metal interconnections are formed to complete the integrated circuit.

DESCRIPTION OF THE PREFERRED EMBODIMENT

The method for making these embedded DRAM devices compatible with logic circuits having salicide FETs is now described. Typically it is desirable to form DRAM circuits on semiconductor substrates having high-performance logic circuits. Unfortunately, to achieve high-performance logic circuits, self-aligned silicide (salicide) FETs require shallow diffused junctions and thin self-aligned silicide contacts. The salicide FETs for logic and DRAM FETs are typically formed first prior to forming the DRAM stacked capacitors. The conventional DRAMs that use polysilicon layers and an interelectrode layer of $SiO_2/Si_3N_4/SiO_2$ (ONO) require high-temperature processing for making capacitors, which degrades the salicide FETs. The FET gate oxides, sidewall spacers, and ion implantations are individually optimized for the salicide FETs (logic) and for the DRAM FETs to maximize the overall circuit performance and yield. The process described here is for making only N-channel FETs in the logic circuits to simplify the drawings and discussion. However, it should also be well understood by one skilled in the art that by including additional process steps, in addition to those described in this embodiment, other types of devices can be included on the logic and DRAM circuits. For example, by including N-well and P-well regions on a substrate, P-channel and-channel FETs can be made from which Complementary Metal-Oxide-Semiconductor (CMOS) circuits can be formed. Further, the salicide FETs formed in the logic portion of the chip can also be used for the peripheral read/write circuits on the DRAM portion of the chip to further improve performance.

Figure 1:
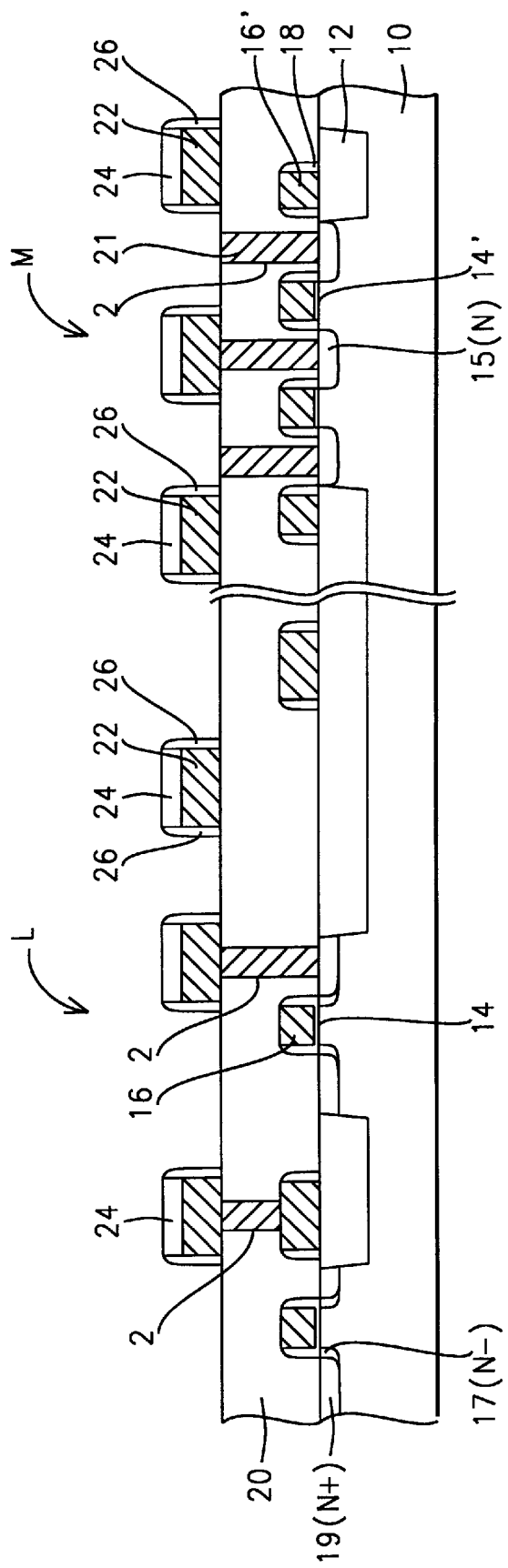
FIGS. 1 through 8 are schematic cross-sectional views showing the sequence of process steps for making embedded DRAMs on logic circuits that are compatible with high-performance salicide FETs.

Referring now to FIG. 1, a substrate 10 having a region L for logic circuits and a region M for DRAM circuits is shown. Typically the substrate 10 is a P⁻ doped single-crystal silicon having a <100> crystallographic orientation. Field oxide regions 12 are formed surrounding and electrically isolating the device areas in both the logic region L and DRAM region M. For advanced high-density circuits the preferred field oxide 12 is a Shallow Trench Isolation (STI), as is commonly practiced in the semiconductor industry. Generally the STI is formed by etching trenches in the field oxide areas on the substrate to a depth of between about 3000 and 4000 Angstroms. The trenches are filled with an insulating material, such as $SiO_2$, that is made planar with the surface of the substrate 10 using a planarizing etching back or by chemical-mechanical polishing (CMP).

Still referring to FIG. 1, the salicide FETs in region L are formed next. A thin gate oxide 14 is formed in the device areas, and a polysilicon layer 16 is deposited and patterned to form gate electrodes. Lightly doped source/drain areas 17(N⁻) are formed by ion implantation, sidewall spacers 18 are formed on the gate electrodes by depositing a $Si_3N_4$ layer and anisotropically etching back. Heavily doped source/drain contacts 19(N⁺) are implanted to provide low contact resistance. Typically for current high-performance FETs, the channel length is 0.18 um or less, and the source/drain junction depths are less than 0.1 um. Next, a thin metal layer, such as titanium (Ti), (not shown) is deposited and annealed to form titanium silicide ($TiSi_x$) contacts on the source/drain contacts 19(N⁺) and also to form a $TiSi_x$ on the polysilicon gate electrodes 16 to reduce resistivity. The unreacted titanium is removed from the remaining insulating (silicon oxide or nitride) surfaces to form the salicide FETs, as is commonly practiced in the industry. The FETs for the memory region M are formed using a gate oxide 14', a patterned polycide layer 16', and also source/drain areas 15(N) that optimize the process yield for the DRAM cells.

Still referring to FIG. 1, and more specifically to the method of this invention, the stacked capacitors using low-temperature processing are made by depositing a first insulating layer 20. The first insulating layer 20, commonly referred to as an interlevel dielectric (ILD) layer, is preferably $SiO_2$, and is deposited by LPCVD using tetraethosiloxane (TEOS) or TEOS and ozone ($O_3$) as the reactant gas. Layer 20 is then planarized by chemical-mechanical polishing to have a thickness of between about 6000 and 10000 Angstroms over the FETS.

Next, as shown in FIG. 1 first openings 2 are etched in the planar first insulating layer 20 to form the contact openings to the source/drain contacts 19(N⁺) and to the salicide FET gate electrodes 16. Concurrently openings 2 are also etched for the bit-line contacts 15(N) and for the capacitor node contacts in the memory regions M. Conventional photolithographic techniques and anisotropic etching are used to etch the openings 2. For example, the etching can be carried out using high-density plasma etching and an etchant gas mixture containing fluorine (F).

Continuing with FIG. 1, a metal layer 21, preferably tungsten (W), is deposited to a thickness sufficient to fill the contact openings 2. Layer 21 is deposited preferably by low-temperature CVD using $WF_6$ and $H_2$ as the reactant gas mixture, and at a temperature less than about 500° C. The tungsten layer is then polished or etched back to the first insulating layer 20 to form metal plugs 21 in the contact openings 2. Optionally, a Ti/TiN barrier/adhesion layer (not shown) can be included to improve the adhesion of the tungsten. Next, a first metal layer 22 is deposited. Layer 22 is preferably aluminum-copper (AlCu) and is deposited at low temperature (less than 400° C.) by physical vapor deposition, for example by sputter deposition to a preferred thickness of between about 4000 and 6000 Angstroms. A $Si_3N_4$ cap layer 24 is deposited on the AlCu by PECVD using $SiCl_2H_2$ and $NH_3$ as the reactant gas mixture and at a temperature of about 400° C. or less. The cap layer 24 is deposited to a preferred thickness of between about 1500 and 3000 Angstroms. Using conventional photolithographic techniques and anisotropic plasma etching are then used to pattern the $Si_3N_4$ cap layer 24 and the AlCu layer 22 to form a first level of metal interconnections and concurrently to form the bit lines for the DRAM circuits in region M. The $Si_3N_4$ layer 24 is patterned using reactive ion etching (RIE) and an etchant gas mixture containing fluorine, and the AlCu layer 22 is patterned using RIE and an etchant gas mixture containing chlorine (Cl). A blanket conformal $Si_3N_4$ layer is then deposited and etched back to form sidewall spacers 26 on the metal interconnections 22 and also on the bit lines 22 in memory region M. A thin insulating liner (not shown) is deposited. Preferably the liner is composed of silicon oxynitride (SiON) or $Si_3N_4$, and is deposited by PECVD to a thickness of between about 100 and 400 Angstroms. The thin liner is used as an etch-stop layer when openings are etched for the capacitors.

Figure 2:
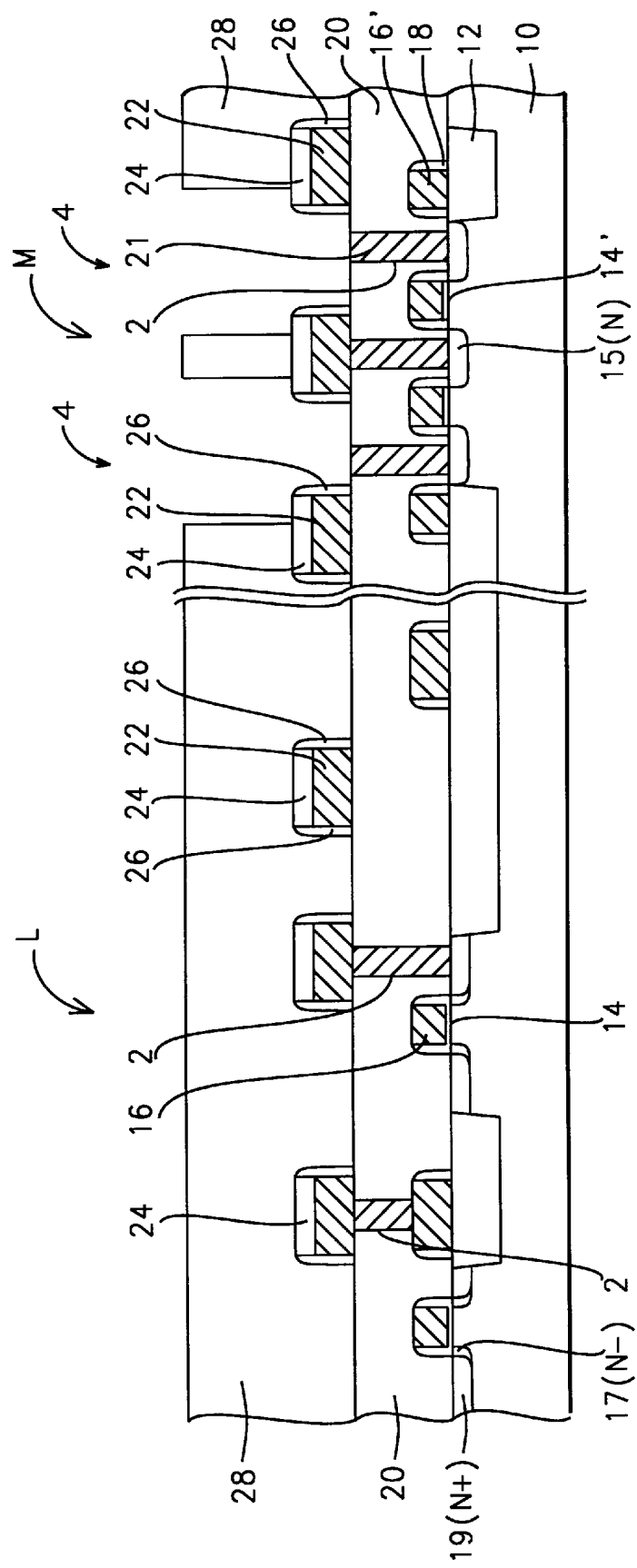

Referring now to FIG. 2, a relatively thick second insulating layer 28 is deposited. The second insulating layer is commonly referred to in the industry as an intermetal dielectric (IMD) layer. Layer 28 is preferably composed of $SiO_2$ or a doped $SiO_2$, such as borophosphosilicate glass (BPSG), and is deposited at low temperature (e.g., less than about 400° C.) by PECVD using TEOS and appropriate boron and phosphorus dopant gases. Layer 28 is then planarized over the first level of interconnections and bit lines 22 using chemical-mechanical polishing to provide a final thickness of between about 8000 and 12000 Angstroms over the interconnections and bit lines.

Referring still to FIG. 2, conventional photolithographic techniques and anisotropic plasma etching are used to etch second openings 4 in the second insulating layer 28 over and to the capacitor node contacts 21, resulting in self-aligned contact openings. The openings 4 are preferably etched using RIE and an etchant gas mixture containing fluorine and oxygen. The openings 4 extend over the bit lines 22, and are selectively etched to the $Si_3N_4$ cap layer 24 and the sidewall spacers 26, which protect the bit lines from shorting to the bottom electrodes when the capacitor bottom electrodes are formed next in the openings 4.

Figure 3:
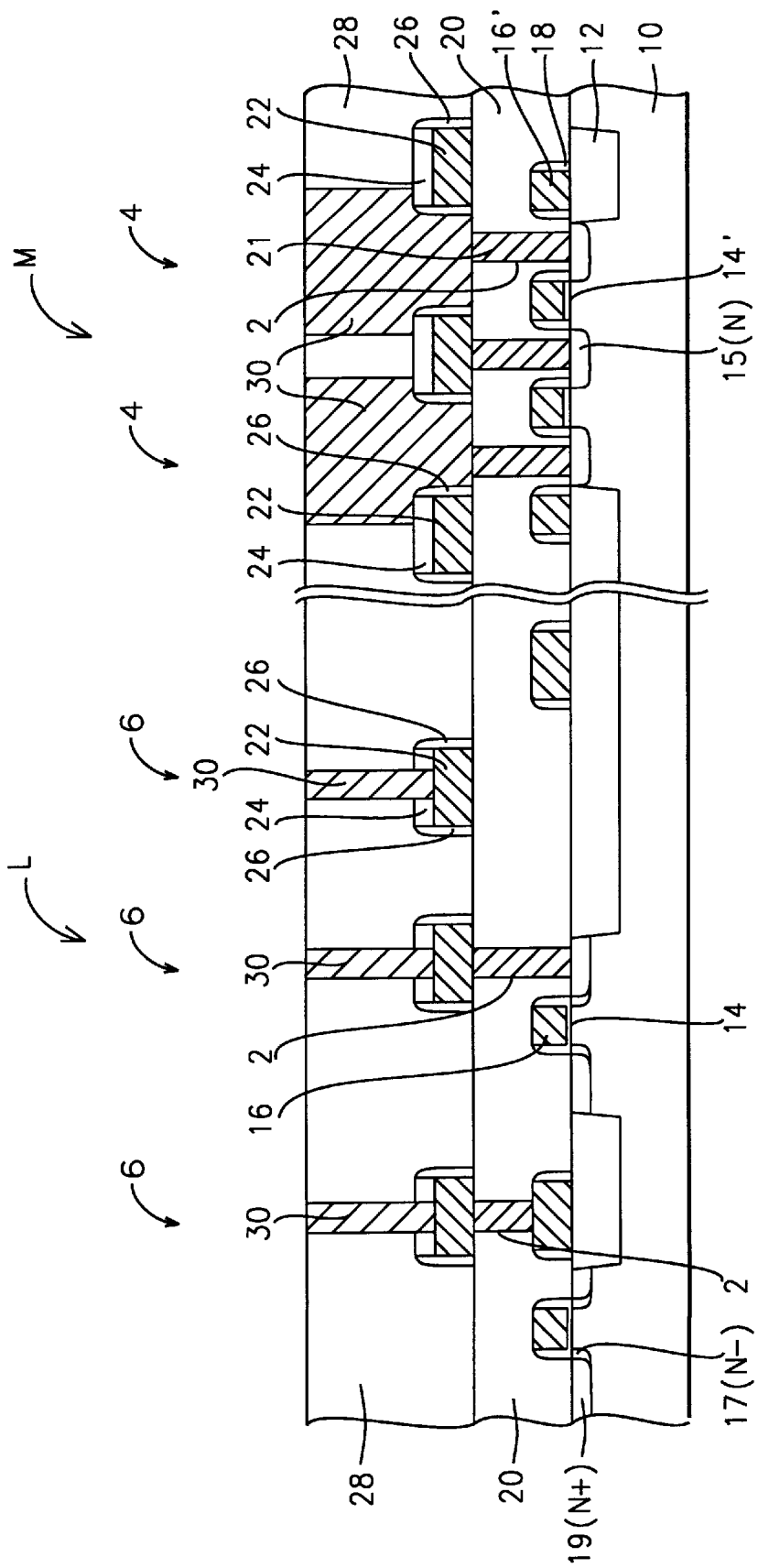

Referring now to FIG. 3, another photolithographic masking step and anisotropic plasma etching are used to etch via holes 6 in the second insulating layer 28 and in the $Si_3N_4$ cap layer 24 to the first level of metal interconnections 22 in the logic region L. A metal layer 30, preferably tungsten (W), is then deposited to fill the second openings 4 and the via holes 6. The tungsten layer 30 is chemically-mechanically polished back to the second insulating layer 28 to concurrently form capacitor bottom electrodes 30 in the openings 4 in the memory region M and to form W metal plugs 30 in the via holes 6 in the logic region L. The W layer 30 is preferably deposited at a relatively low temperature of less than 400° C. using a CVD deposition tool and a reactant gas mixture such as $WF_6$ and $H_2$.

Figure 4:
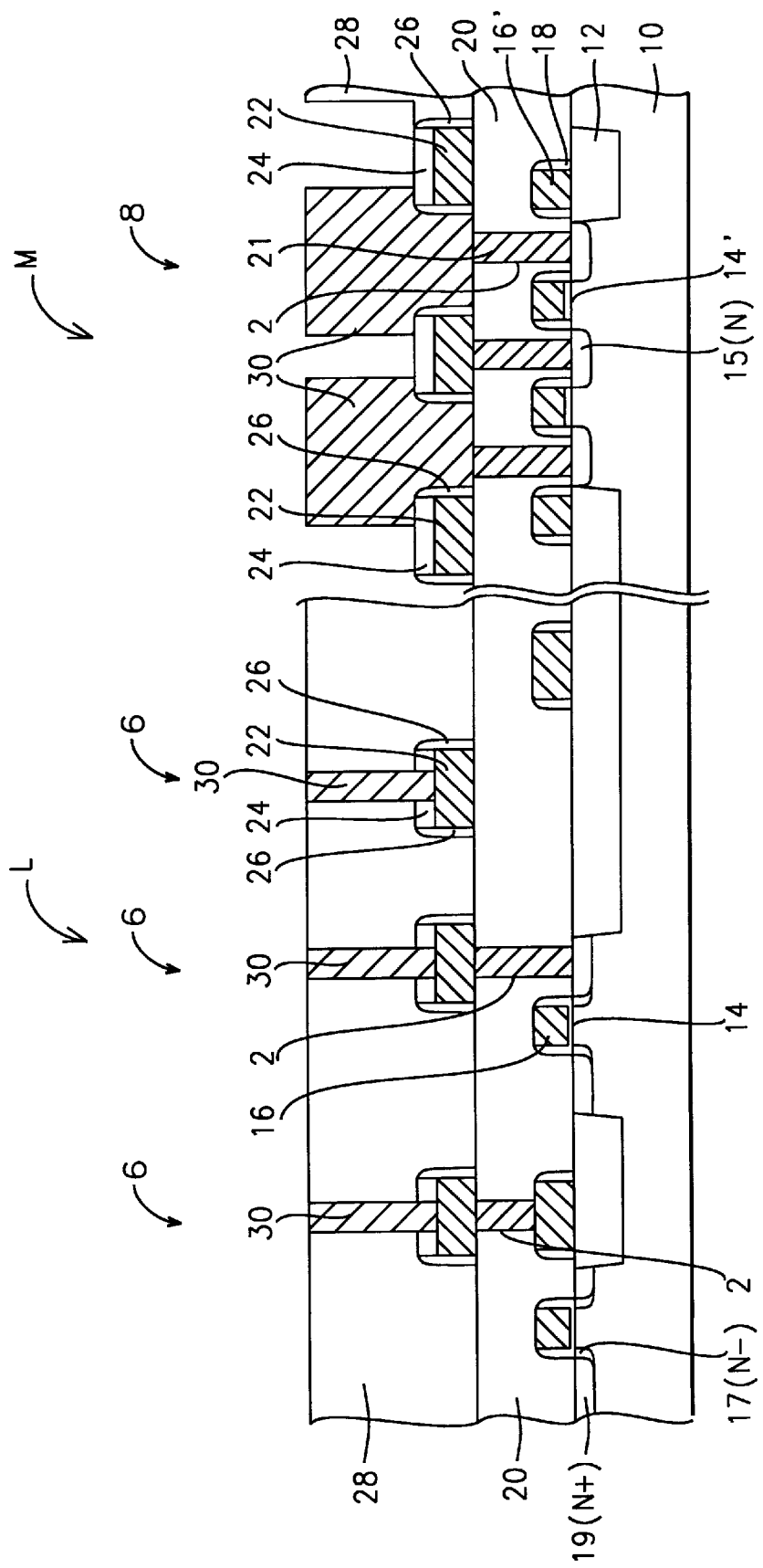

Referring to FIG. 4, the second insulating layer 28 can be etched to form recesses 8 around the capacitor bottom electrodes 30 to increase the surface area of the bottom electrodes, thereby increasing the capacitance of the DRAM capacitors. The recesses are preferably etched using dry etching and an etchant gas mixture containing F. Alternatively, a wet etch such as a hydrofluoric (HF) acid solution that etches the $SiO_2$ layer 28 selectively to the $Si_3N_4$ cap layer 24 and the $Si_3N_4$ sidewall spacers 26 can be used.

Figure 5:
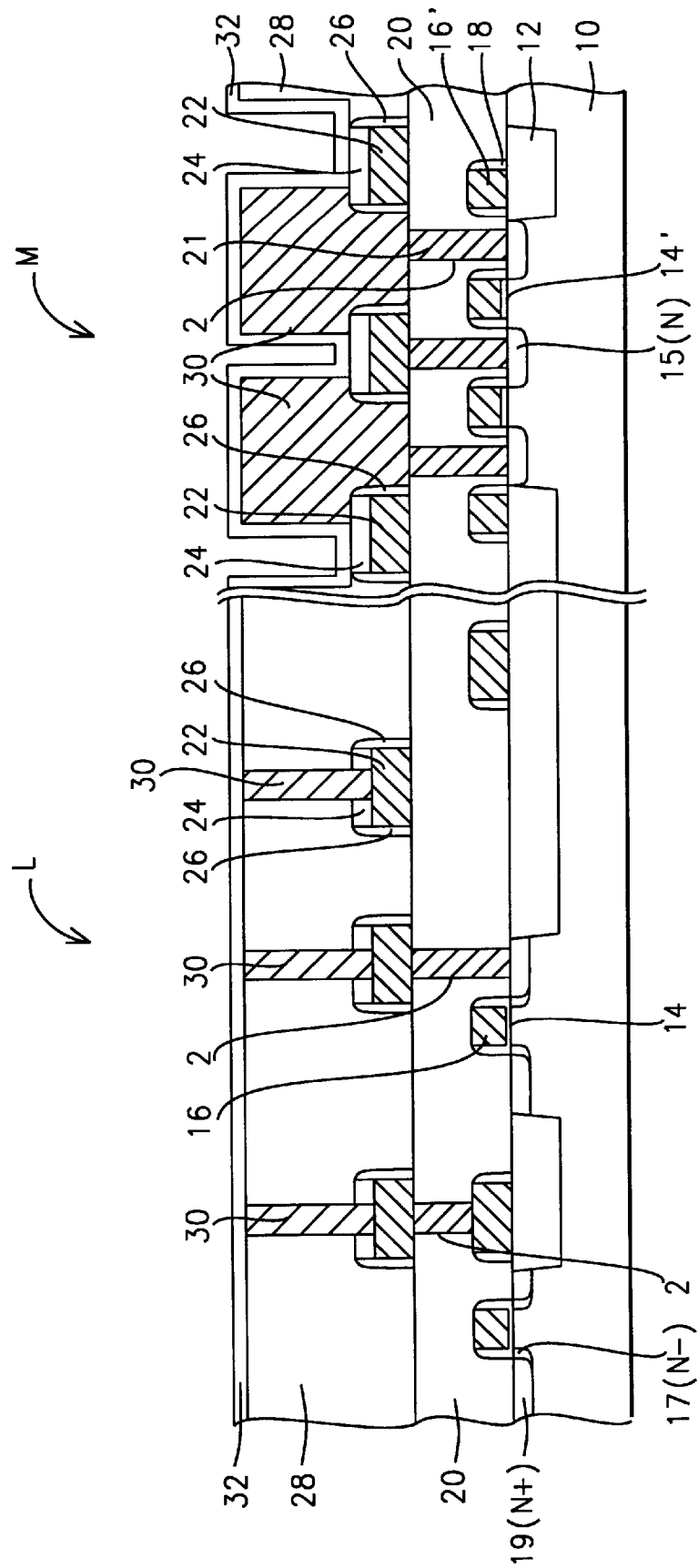

Referring next to FIG. 5 and continuing with the process, an interelectrode dielectric layer 32 is deposited on the substrate and over the exposed capacitor bottom electrodes 30. The interelectrode dielectric layer 32 is preferably a high-dielectric-constant material that is deposited at a relatively low temperature of about 400 to 450° C., compared to $SiO_2/Si_3N_4/SiO_2$ (ONO) which is deposited at about 700 to 800° C. One preferred dielectric material is tantalum pentoxide ($Ta_2O_5$) which can be deposited by RF sputter deposition. Alternatively, barium strontium titanium oxide ($BaSrTiO_3$), commonly referred to as BST, can be used for the dielectric layer 32 and is also deposited by RF sputter deposition. The dielectric layer 32 composed of $Ta_2O_5$ is preferably deposited to a thickness of between about 100 and 300 Angstroms. Since the dielectric constant K of the $Ta_2O_5$ is 21 and the dielectric constant of BST is greater than 50, compared to a K of 13–14 for ONO, therefore a thicker dielectric layer 32 can be used to achieve an equivalent capacitance of a thinner ONO layer.

Figure 6:
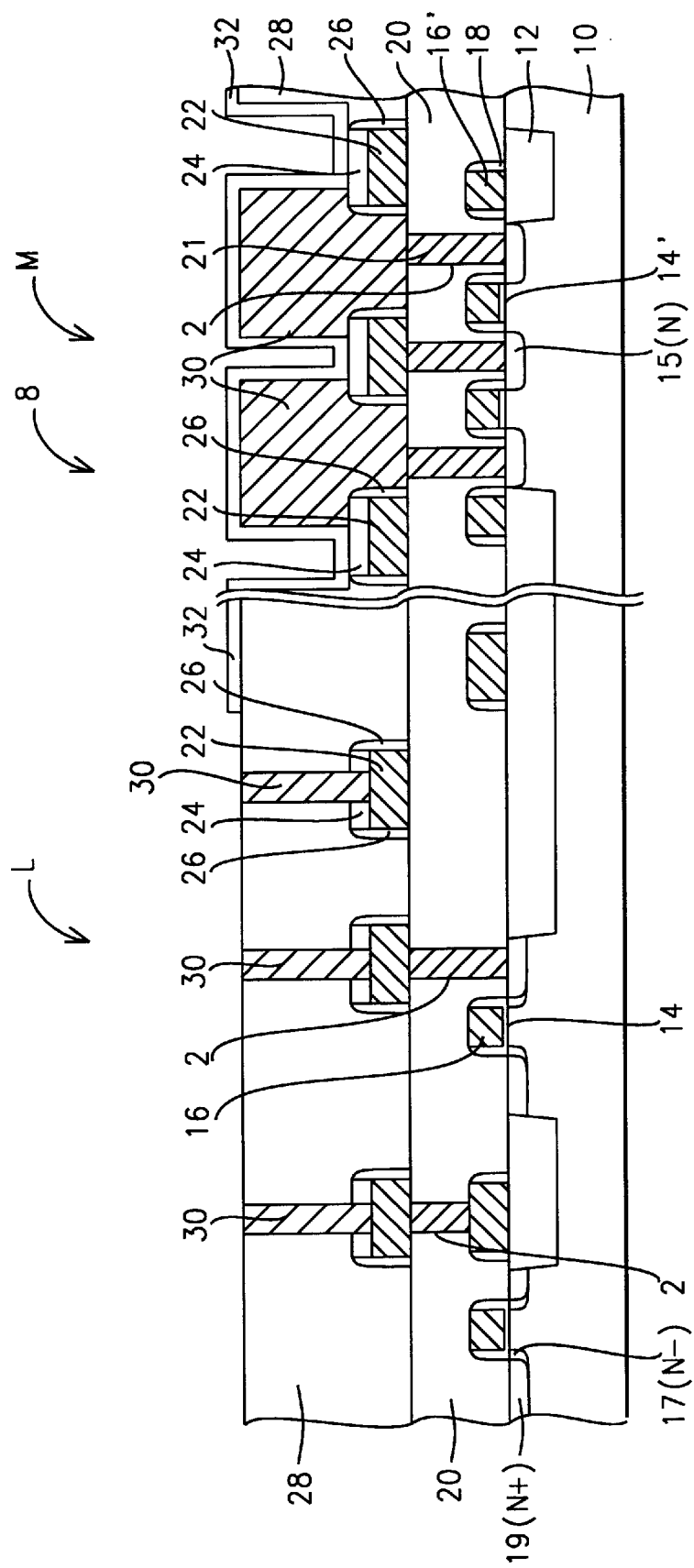

Now as depicted in FIG. 6, the interelectrode dielectric layer 32 is patterned using conventional photolithographic techniques and plasma etching to leave portions over the capacitor bottom electrodes 30 in the recessed openings 8. For example, layer 32 can be etched by RIE using an etchant gas mixture containing either F or Cl. The dielectric layer 32 is also removed over the metal plugs 30 in the logic region L for the next level of metal interconnections.

Figure 7:
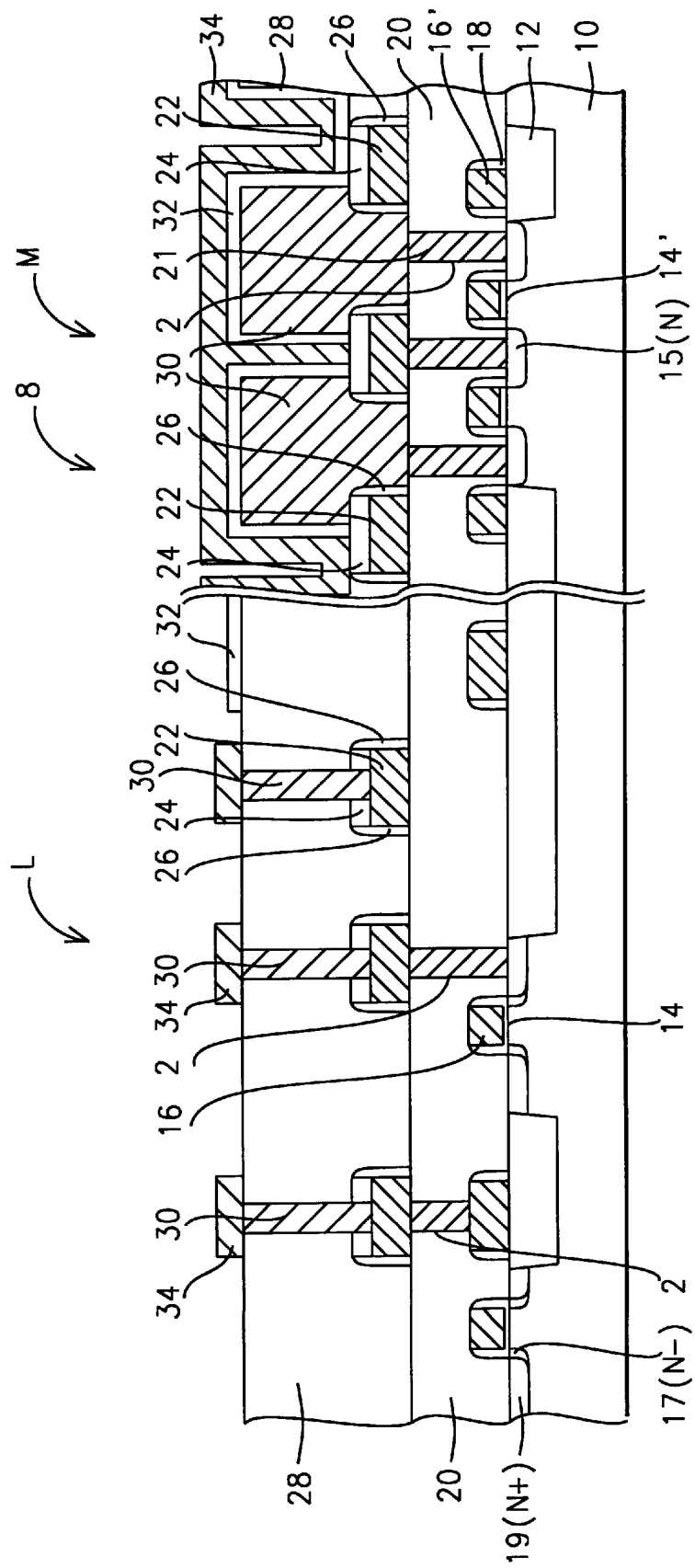

Referring to FIG. 7, a second metal layer 34 is deposited and patterned to form a second level of electrical interconnections 34 and concurrently to form the capacitor top electrodes. Metal layer 34 is preferably AlCu and is deposited at a low temperature of about 400° C. by physical vapor deposition (PVD) and is deposited to a thickness of between about 4000 and 6000 Angstroms. The second metal layer is then patterned using conventional photolithographic techniques and anisotropic plasma etching. For example, the plasma etching can be carried out using RIE and an etchant gas mixture containing C12, such as a gas mixture of $Cl_2/CHF_3/BCl_3$/BHe and using a carrier gas of Ar.

Figure 8:
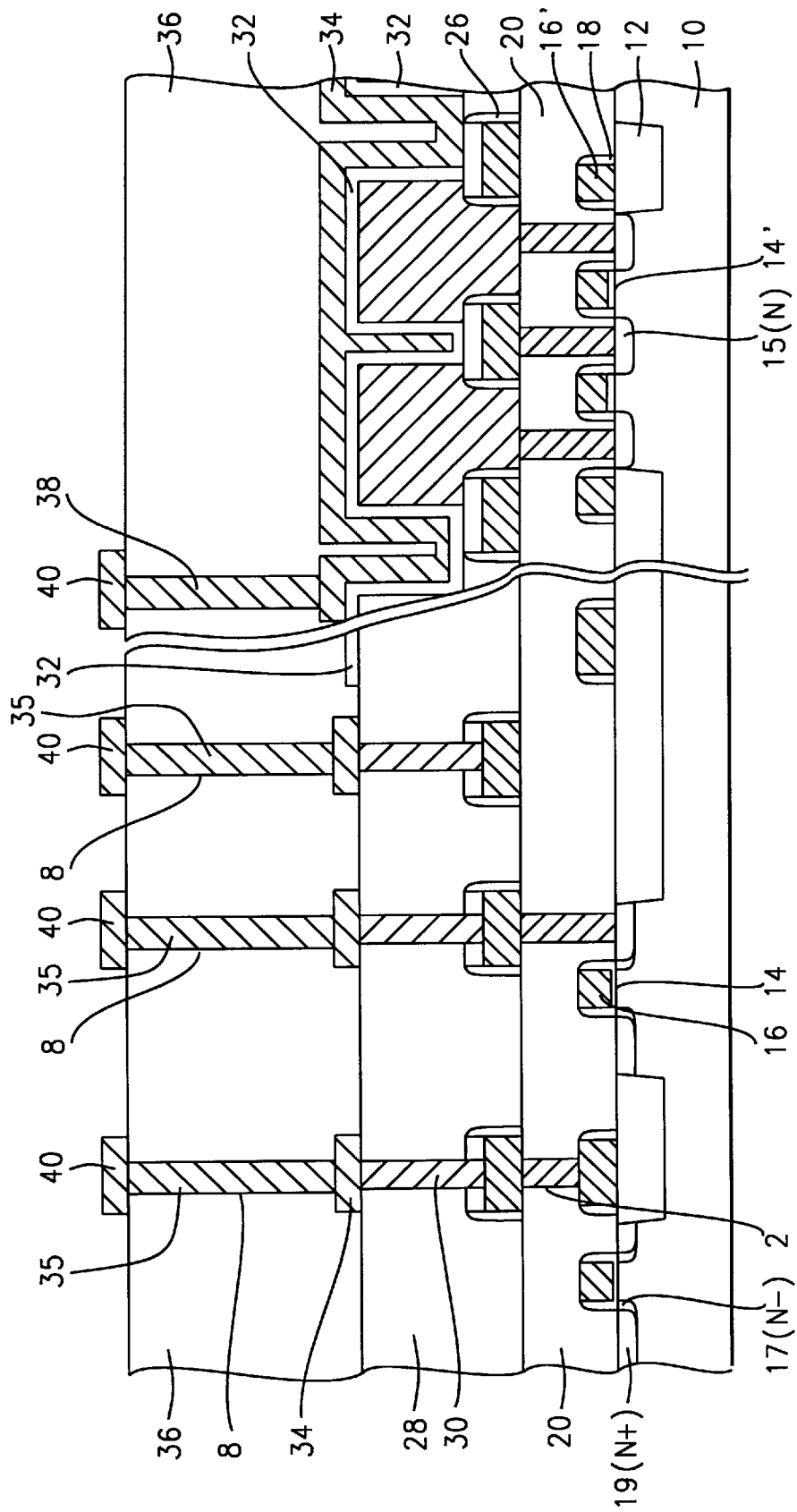

As shown in FIG. 8, a third insulating layer 36 is deposited to electrically insulate the completed DRAM stacked capacitors. The third insulating layer 36 is deposited at low temperature (less than 400° C.) by PECVD using TEOS as the reactant gas, and is planarized by CMP to have a thickness of between about 8000 and 12000 Angstroms over the capacitor top electrodes. Additional levels of metal interconnections are now formed to complete the integrated circuit. The next level of metal interconnections (M3) is also depicted in FIG. 8. After planarizing layer 36, via holes 8 are etched and metal plugs 38 are formed in the via holes. The third metal layer 40, for example AlCu, is deposited and patterned to form the third level of metal interconnections 40. This low temperature process (less than 400° C.) for making the metal interconnections can be repeated the desired number of times to complete the embedded DRAM/logic circuits without electrically degrading the high-performance salicide FETs having shallow diffused source/drain junctions with thin silicide contacts.

While the invention has been particularly shown and described with reference to the preferred embodiment thereof, it will be understood by those skilled in the art that various changes in form and details may be made without departing from the spirit and scope of the invention. Although the invention is described for semiconductor circuits having AlCu metal interconnections and tungsten plugs, it should also be understood by those skilled in the art that other metals that are deposited at low temperatures can also be used. For example, the metal interconnection can be formed from copper with appropriate adhesion layers to further reduce resistance and improve performance.

What is claimed is:

1. A method for fabricating embedded DRAM circuits with logic circuits comprising the steps of:
   providing a semiconductor substrate having logic regions and memory regions having device areas, said logic regions having salicide FETS;
   forming a planar first insulating layer on said substrate;
   etching first openings in said first insulating layer for contacts to said salicide FETs and concurrently etching openings for bit-line contacts and capacitor node contacts in said memory regions;
   forming metal plugs in said openings;
   forming a patterned first metal layer for a first level of metal interconnections including bit lines for said DRAM circuits;
   forming a planar second insulating layer and etching second openings over and to said capacitor node contacts, and etching via holes for said salicide FETs, and forming metal bottom electrodes in said second openings and metal contacts in said via holes;
   depositing and patterning an interelectrode dielectric layer leaving portions over said capacitor bottom electrodes;
   depositing and patterning a second metal layer to form a second level of interconnections and concurrently forming capacitor top electrodes.

2. The method of claim 1, wherein said metal plugs are tungsten deposited by low-pressure chemical vapor deposition using tungsten hexafluoride as the reactant gas, and deposited at a temperature of between about 300 and 400° C.

3. The method of claim 1, wherein said patterned first metal layer is aluminum-copper alloy deposited by physical vapor deposition to a thickness of between about 4000 and 6000 Angstroms, and said patterned aluminum-copper layer includes a silicon nitride insulating layer on its top surface and on its sidewalls.

4. The method of claim 1, wherein said second insulating layer is silicon oxide, deposited by plasma-enhanced chemical vapor deposition at a temperature of between about 100 and 400° C., and is planarized by chemical-mechanical polishing to have a thickness of between about 8000 and 12000 Angstroms over said patterned first metal layer.

5. The method of claim 1, wherein said metal bottom electrodes are formed by depositing a tungsten layer using low-pressure chemical vapor deposition and tungsten hexafluoride as the reactant gas at a temperature of between about 300 and 400° C., and polishing back said tungsten to said second insulating layer.

6. The method of claim 1, wherein said second insulating layer is recessed over said bottom electrodes to increase the surface area of said bottom electrodes thereby increasing capacitance.

7. The method of claim 1, wherein said interelectrode dielectric layer is a material selected from the group that includes tantalum pentoxide and barium strontium titanium oxide, and said layer is deposited at a temperature that is less than 400° C.

8. The method of claim 1, wherein said patterned second metal layer is aluminum-copper alloy deposited by physical vapor deposition to a thickness of between about 4000 and 6000 Angstroms.

9. A method for fabricating embedded DRAM circuits with logic circuits comprising the steps of:
   providing a semiconductor substrate having logic regions and memory regions having device areas, said logic regions having salicide FETs;
   forming a planar first insulating layer on said substrate;
   etching first openings in said first insulating layer for contacts to said salicide FETs and concurrently etching openings for bit-line contacts and capacitor node contacts in said memory regions;
   forming metal plugs, composed of tungsten, in said openings;
   forming a patterned first metal layer, composed of aluminum-copper alloy, for a first level of metal interconnections including bit lines for said DRAM circuits;
   forming a planar second insulating layer and etching second openings over and to said capacitor node contacts, and etching via holes for said salicide FETs, and forming tungsten bottom electrodes in said second openings and tungsten contacts in said via holes;
   depositing and patterning an interelectrode dielectric layer leaving portions over said capacitor bottom electrodes;
   depositing and patterning a second metal layer to form a second level of interconnections and concurrently forming capacitor top electrodes.

10. The method of claim 9, wherein said metal plugs composed of tungsten are deposited by low-pressure chemical vapor deposition using tungsten hexafluoride as the reactant gas, and deposited at a temperature of between about 300 and 400° C.

11. The method of claim 9, wherein said patterned aluminum-copper alloy first metal layer is deposited by physical vapor deposition to a thickness of between about 4000 and 6000 Angstroms, and said patterned aluminum-copper layer includes a silicon nitride insulating layer on its top surface and on its sidewalls.

12. The method of claim 9, wherein said second insulating layer is silicon oxide, deposited by plasma-enhanced chemical vapor deposition at a temperature of between about 100 and 400° C., and is planarized by chemical-mechanical polishing to have a thickness of between about 8000 and 12000 Angstroms over said patterned first metal layer.

13. The method of claim 9, wherein said bottom electrodes are formed by depositing a tungsten layer at low-pressure chemical vapor deposition using tungsten hexafluoride as the reactant gas and deposited at a temperature of between about 300 and 400° C., and polishing back said tungsten to said second insulating layer.

14. The method of claim 9, wherein said second insulating layer is recessed over said bottom electrodes to increase the surface area of said bottom electrodes thereby increasing capacitance.

15. The method of claim 9, wherein said interelectrode dielectric layer is a material selected from the group that includes tantalum pentoxide and barium strontium titanium oxide, and said layer is deposited at a temperature that is less than 400° C.

16. The method of claim 9, wherein said patterned second metal layer is aluminum-copper alloy deposited by physical vapor deposition to a thickness of between about 4000 and 6000 Angstroms.

* * * * *